United States Patent
Varlan et al.

(10) Patent No.: US 10,672,918 B2
(45) Date of Patent: Jun. 2, 2020

(54) PHOTOVOLTAIC PANEL RAPID SHUTDOWN AND RECOVERY

(71) Applicant: Solantro Semiconductor Corp., Ottawa (CA)

(72) Inventors: Mihai Varlan, Ottawa (CA); Anthony Peter Ernest Reinberger, Nepean (CA); Edward Patrick Keyes, Ottawa (CA)

(73) Assignee: SOLANTRO SEMICONDUCTOR CORP. (CA)

( * ) Notice: Subject to any disclaimer, the term of this patent is extended or adjusted under 35 U.S.C. 154(b) by 222 days.

(21) Appl. No.: 15/653,961

(22) Filed: Jul. 19, 2017

(65) Prior Publication Data

US 2019/0027617 A1 Jan. 24, 2019

(51) Int. Cl.
| | |
|---|---|
| *H01L 31/02* | (2006.01) |
| *H02S 50/10* | (2014.01) |
| *H02H 3/02* | (2006.01) |
| *H02H 3/06* | (2006.01) |
| *H02J 7/35* | (2006.01) |
| *H02H 7/20* | (2006.01) |
| *H02H 1/00* | (2006.01) |
| *H02H 11/00* | (2006.01) |
| *H02J 3/38* | (2006.01) |

(52) U.S. Cl.
CPC ....... *H01L 31/02021* (2013.01); *H02H 1/003* (2013.01); *H02H 3/021* (2013.01); *H02H 3/066* (2013.01); *H02H 7/205* (2013.01); *H02H 11/001* (2013.01); *H02J 7/35* (2013.01); *H02S 50/10* (2014.12); *H02J 3/383* (2013.01)

(58) Field of Classification Search
CPC .............. H01L 31/02021; H02H 1/003; H02H 11/001; H02H 7/205; H02H 3/066; H02H 3/021; H02S 50/10; H02J 7/35; H02J 3/383
USPC ......................................................... 324/539
See application file for complete search history.

(56) References Cited

U.S. PATENT DOCUMENTS

| 4,695,788 A * | 9/1987 | Marshall ................. H02S 50/10 324/527 |
| 8,531,055 B2 | 9/2013 | Adest et al. |
| 9,269,834 B2 * | 2/2016 | Osterloh ........... H01L 31/02021 |

(Continued)

OTHER PUBLICATIONS

Arielle Campanalie "Photovoltaic System Monitoring," Today's Energy Solutions, Jun. 2016 (3 pages).

*Primary Examiner* — Christopher P McAndrew

(74) *Attorney, Agent, or Firm* — Barnes & Thornburg LLP

(57) ABSTRACT

A test signal is applied from a continuity test source to a photovoltaic (PV) panel string, to test electrical continuity in the PV panel string and between the PV panel string and an inverter that is coupled to the PV panel string. If the test signal is detected at a PV panel disconnect switch that is separate from the continuity test source and switchably couples one or more Direct Current (DC) PV panels in the PV panel string, then the PV panel disconnect switch is controlled to connect the one or more DC PV panels in the PV panel string. Otherwise, the PV panel disconnect switch is controlled to disconnect the one or more DC PV panels from the PV panel string. The test signal could be, for example, an Alternating Current (AC) signal tuned to a PV installation that includes the PV panel string and the inverter.

21 Claims, 11 Drawing Sheets

(56) References Cited

U.S. PATENT DOCUMENTS

| | | | |
|---|---|---|---|
| 2010/0085670 A1* | 4/2010 | Palaniswami | H02H 7/20 361/42 |
| 2010/0127576 A1* | 5/2010 | Ahlborn | H02M 7/72 307/151 |
| 2010/0139743 A1* | 6/2010 | Hadar | H02J 3/383 136/251 |
| 2010/0237704 A1* | 9/2010 | Nakajima | H02M 5/14 307/83 |
| 2011/0125431 A1* | 5/2011 | Adest | H02M 3/10 702/58 |
| 2011/0210611 A1* | 9/2011 | Ledenev | H01L 31/02021 307/71 |
| 2012/0161801 A1* | 6/2012 | Hasegawa | H01L 31/02021 324/750.01 |
| 2012/0300347 A1* | 11/2012 | Fahrenbruch | H01L 31/02021 361/1 |
| 2013/0058140 A1* | 3/2013 | Victor | H01L 31/02021 363/56.01 |
| 2014/0191582 A1* | 7/2014 | Deboy | H02J 3/383 307/82 |
| 2014/0191589 A1* | 7/2014 | Friebe | H01L 31/02021 307/130 |
| 2014/0265601 A1* | 9/2014 | Orr | H01H 9/00 307/80 |
| 2014/0265603 A1* | 9/2014 | Augustoni | H02S 50/00 307/80 |
| 2015/0180408 A1* | 6/2015 | Pisklak | H02S 50/10 136/244 |
| 2015/0333503 A1* | 11/2015 | Bermingham | H02H 7/268 361/62 |
| 2016/0233830 A1* | 8/2016 | Kouno | H02S 50/10 |
| 2016/0245860 A1* | 8/2016 | Schmidt | G01R 31/311 |
| 2016/0276976 A1* | 9/2016 | Davis | H02S 50/10 |
| 2016/0308365 A1* | 10/2016 | Mayer | H02J 3/383 |
| 2016/0329715 A1 | 11/2016 | Orr et al. | |

* cited by examiner

PHOTOVOLTAIC PANEL RAPID SHUTDOWN AND RECOVERY

TECHNICAL FIELD

The embodiments herein generally relate to photovoltaic (PV) panels and PV power systems, and more particularly to safely controlling the connection of PV panels to a PV power system after a shutdown.

BACKGROUND

PV solar panels are an important source of electrical power. A typical PV panel is organized as a series connection of individual PV cells. A common configuration is 72 PV cells per panel. A typical PV cell operating voltage under full illumination is approximately 0.7 V. An illuminated PV panel with 72 Direct Current (DC) PV cells will therefore have an open circuit output voltage of approximately 50 volts DC. PV panels are typically serially connected to form a "panel string". In a DC PV panel system, the output of the panel string could connect to an inverter which converts the DC power of the PV panels into Alternating Current (AC) power suitable for an electrical grid. Typically, there are between five and twenty PV panels in a panel string producing a combined string DC voltage in the hundreds of volts.

PV panels produce power whenever they are illuminated. The voltages on a panel string could reach hazardous levels and constitute a safety hazard since the PV panels continue to generate voltage even when the PV system is disconnected from the electrical grid.

SUMMARY

Illustrative embodiments are disclosed by way of example herein.

According to one aspect of the present disclosure, a method involves: applying a test signal, from a continuity test source to a PV panel string, to test electrical continuity in the PV panel string and between the PV panel string and an inverter that is coupled to the PV panel string; monitoring for presence of the test signal at a PV panel disconnect switch that switchably couples one or more of a plurality of DC PV panels in the PV panel string; controlling the PV panel disconnect switch to connect the one or more DC PV panels in the PV panel string where the test signal is present at the PV panel disconnect switch; controlling the PV panel disconnect switch to disconnect the one or more DC PV panels from the PV panel string where the test signal is not present at the PV panel disconnect switch.

According to a further aspect, an apparatus includes: a PV panel disconnect switch to switchably couple one or more DC PV panels in a PV panel string; a controller, operatively coupled to the PV panel disconnect switch, to monitor for presence of a test signal applied from a continuity test source to the PV panel string for testing electrical continuity in the PV panel string and between the PV panel string and an inverter that is coupled to the PV panel string; to control the PV panel disconnect switch to connect the one or more DC PV panels in the PV panel string where the test signal is present at the PV panel disconnect switch; and to control the PV panel disconnect switch to disconnect the one or more DC PV panels from the PV panel string where the test signal is not present at the PV panel disconnect switch.

A further aspect of the present disclosure relates to a method that involves: monitoring for presence of a test signal, applied from a continuity test source to a PV panel string to test electrical continuity in the PV panel string and between the PV panel string and an inverter that is coupled to the PV panel string, at a PV panel disconnect switch that switchably couples one or more of a plurality of DC PV panels in the PV panel string; controlling the PV panel disconnect switch to connect the one or more DC PV panels in the PV panel string where the test signal is present at the PV panel disconnect switch; controlling the PV panel disconnect switch to disconnect the one or more DC PV panels from the PV panel string where the test signal is not present at the PV panel disconnect switch.

Other aspects and features of embodiments of the present disclosure will become apparent to those ordinarily skilled in the art upon review of the following description.

BRIEF DESCRIPTION OF THE DRAWINGS

The embodiments herein will be better understood from the following detailed description with reference to the drawings, in which.

DETAILED DESCRIPTION

Figure 1:
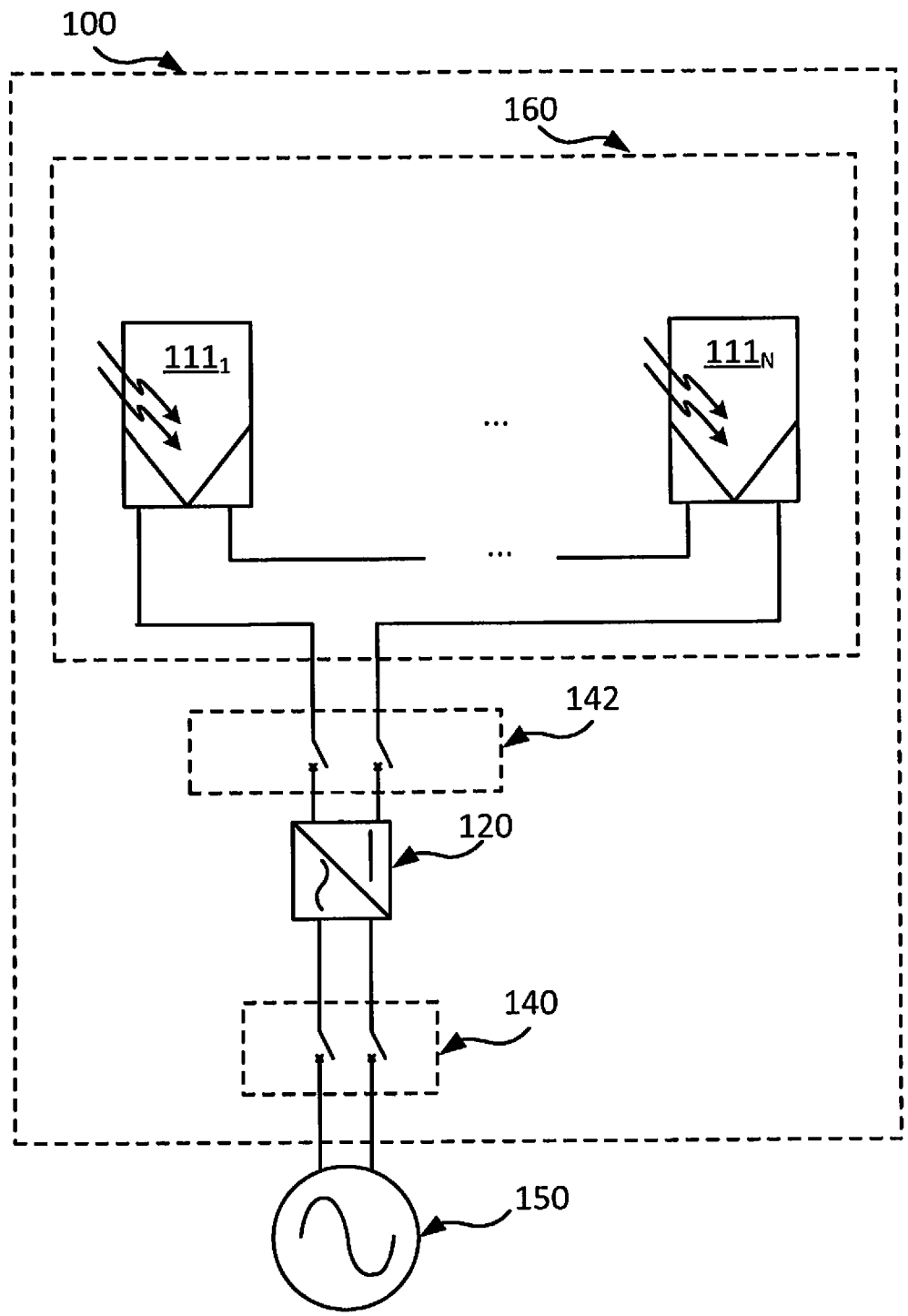
FIG. 1 is a block diagram of an example grid connected PV installation.

FIG. 1 is a block diagram of an example grid connected PV installation 100. PV installation 100 comprises panel string 160, DC disconnect switch 142, inverter 120 and grid disconnect switch 140. Panel string 160 comprises DC PV panels $111_1, \ldots 111_N$ which are serially coupled together. Panel string 160 operatively connects to the input of inverter 120 through DC disconnect switch 142. The AC output of inverter 120 operatively connects to electrical grid 150 through grid disconnect switch 140. Electrical grid 150 could range in size from a large, nation-wide utility grid to a small scale microgrid such as for a remote location like a mining camp. Inverter 120 converts the DC power of panel string 160 to AC power for grid 150. FIG. 1 is an example only and other arrangements are possible in accordance with the embodiments herein. For example, there could be multiple panel strings arranged in parallel and connected to inverter 120 through individual DC disconnect switches. Multiple parallel panel strings could also or instead be connected to inverter 120 through a common DC disconnect switch.

Each of the PV panels $111_1, \ldots 111_N$ could include multiple PV cells, as noted above. Power conductors connecting the PV panels $111_1, \ldots 111_N$ to form the PV string 160 could include cabling and connectors, for example, rated to handle expected string currents and voltages. Any of various types of power switches or circuit breakers, for example, could be used to implement the DC disconnect switch 142 and the grid disconnect switch 140. Similarly, any of various topologies of DC-AC converters could be used to implement the inverter 120.

Power production by a panel string under illumination can represent a potential safety hazard. It could be desirable for the PV panels in a PV installation to isolate themselves from the inverter and the string when a string disconnect condition occurs.

A string disconnect condition could occur, for example, when the PV installation is disconnected from the electrical grid. A PV installation could disconnect from the electrical grid for any of a number of reasons. These could include, for example: a deliberate disconnection for servicing or maintenance purposes; an automatic disconnect in the event of a fault in a PV installation component such as for example, an inverter; an automatic disconnect due to an electrical fault on the electrical grid. A PV installation could also or instead be disconnected from the grid prior to its commissioning. In the case of a building mounted PV installation in which the PV panels could be mounted on the building, or Building Integrated PV (BIPV) installations in which the PV panels are integrated into, for example, the building roof or walls, the PV installation could be deliberately disconnected from the electrical grid in the event of an emergency such as a fire in the building.

A string disconnect condition could also or instead occur, for example, in the event of an open circuit or high resistance condition in the panel string itself. This might be caused by, for example: a physical break in the panel string; removal of one or more PV panels from the panel string for maintenance, repair, or replacement; theft of a PV panel; disconnection of the panel string from an inverter for inverter repair or replacement by opening of a disconnect switch; and/or during initial PV panel installation before all PV panels are installed in a panel string.

A string disconnect condition could also or instead occur in the event of a failure, malfunction or shut down of the inverter.

A string disconnect condition could also or instead occur on loss of power production from the PV panel string. Power production could be lost due to damage to the panels or a loss of illumination.

Isolation of a PV panel from the string could be required under some electrical safety codes. For example, the 2014 United States National Electrical Code (NEC 2014) requires that conductors associated with a PV system, whether AC or DC, be able to be de-energized on demand, so that any portion of the conductors that remain energized do not extend more than 10 feet from the PV array or more than 5 feet within a building. As explained in the NEC 2014 Handbook: "First responders must contend with elements of a PV system that remain energized after the service disconnect is opened. This rapid-shutdown requirement provides a zone outside of which the potential for shock hazard has been mitigated. Conductors more than 5 feet inside a building or more than 10 feet from an array will be limited to a maximum of 30 V and 240 VA within 10 seconds of shutdown." Isolation of PV panels in a panel string could be performed by a Rapid Shutdown Device (RSD) attached to each panel. The RSDs could sense a string disconnect condition and isolate the PV panels from the panel string. After a panel disconnect operation, it is also important to provide for the safe return to service of the PV panels by their RSDs. Reconnection of the panels before the string disconnect condition is cleared could be unsafe.

Figure 2A:
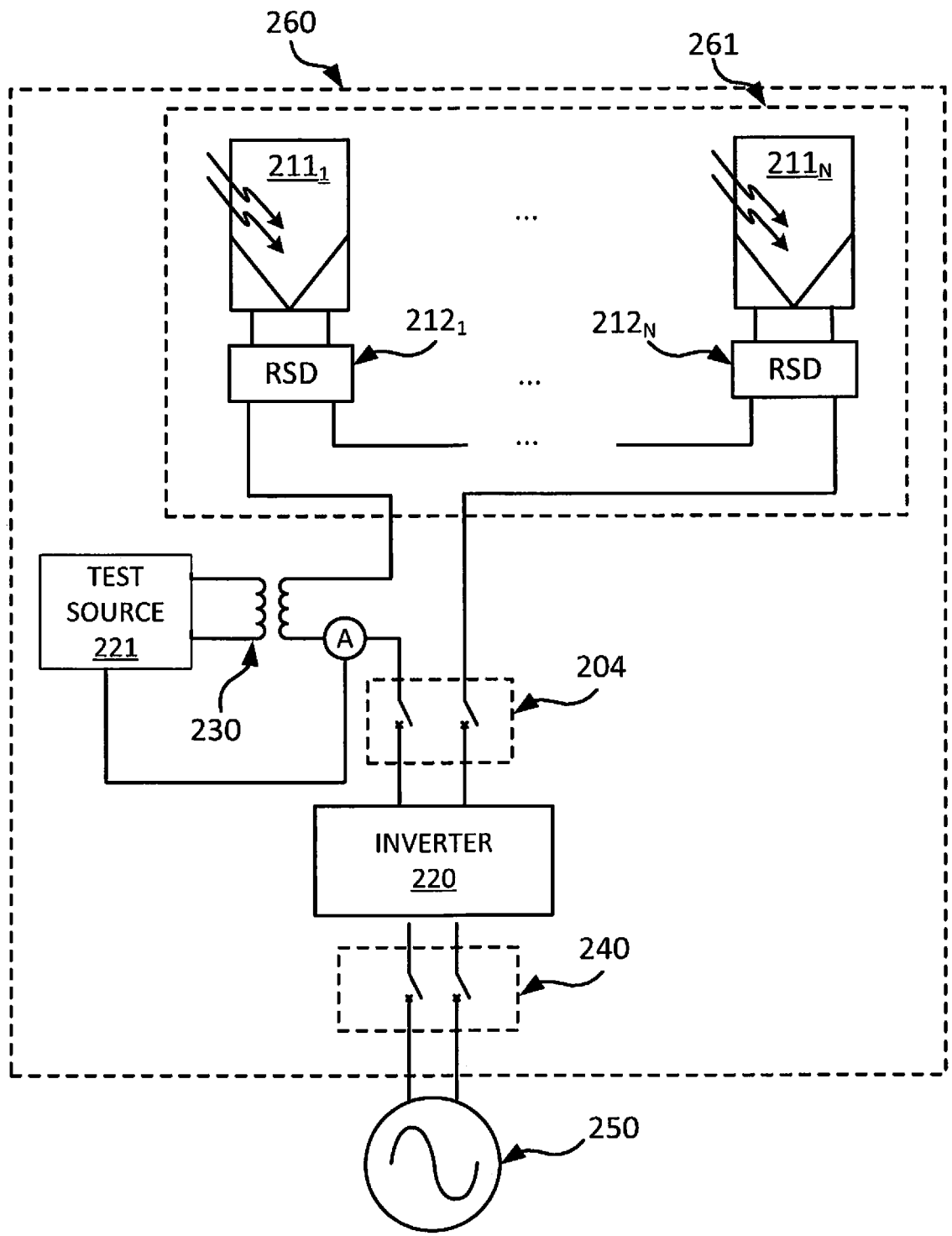
FIG. 2A is a block diagram of an example grid tied PV installation equipped with Rapid Shutdown Devices (RSDs)

FIG. 2A is a block diagram of an example grid tied PV installation 260 equipped with Rapid Shutdown Devices (RSDs). PV installation 260 comprises panel string 261, DC disconnect switch 204, inverter 220, grid disconnect switch 240 and continuity test source 221. Panel string 261 comprises DC PV panels $211_1 \ldots 211_N$ and RSDs $212_1 \ldots 212_N$.

PV panels $211_1 \ldots 211_N$ operatively couple to inverter 220 through respective RSDs $212_1 \ldots 212_N$ and DC disconnect switch 204.

Continuity test source 221 is inductively coupled to PV string 261 though transformer 230. Transformer 230 is shown as connected between PV string 261 and DC disconnect switch 204. In another embodiment, however transformer 230 could be connected between disconnect switch 204 and inverter 220. Although continuity test source 221 is shown as inductively coupled to PV string 261 in other embodiments it could be capacitively coupled or directly (resistively) coupled. For example, a resistor could be placed in series with string 261 and disconnect switch 204 and test source 221 could apply a signal across the resistor.

A potential advantage of inductive coupling is that continuity test source 221 is galvanically isolated from the potentially high DC voltages of PV string 261. In one embodiment transformer 230 has a 1:1 turns ratio between its primary and secondary coils, although other turns ratios are possible.

Continuity test source 221 could produce an AC test signal which couples to PV string 261 through transformer 230.

In an embodiment, continuity test source 221 only produces a test signal when the DC string current drops below a threshold value and stops producing the test signal when the DC string current rises above this value. In one embodiment, this threshold corresponds to a string disconnect condition. This could reduce the power dissipated by the test source. Continuity test source 221 could, for example, include or be coupled to a current sensor such as a resistance.

The continuity test source could also or instead have an internal clock and calendar and could determine the time of sunrise and sunset for its location. The test source could reduce its power consumption by only producing a test signal during daylight hours. This could reduce the power consumption of the test source.

The test source could also or instead have a light sensor which could detect the presence of insolation. The test source could only produce a test signal when the photo sensor indicates that there is insolation. This could reduce the power consumption of the test source.

Figure 9:
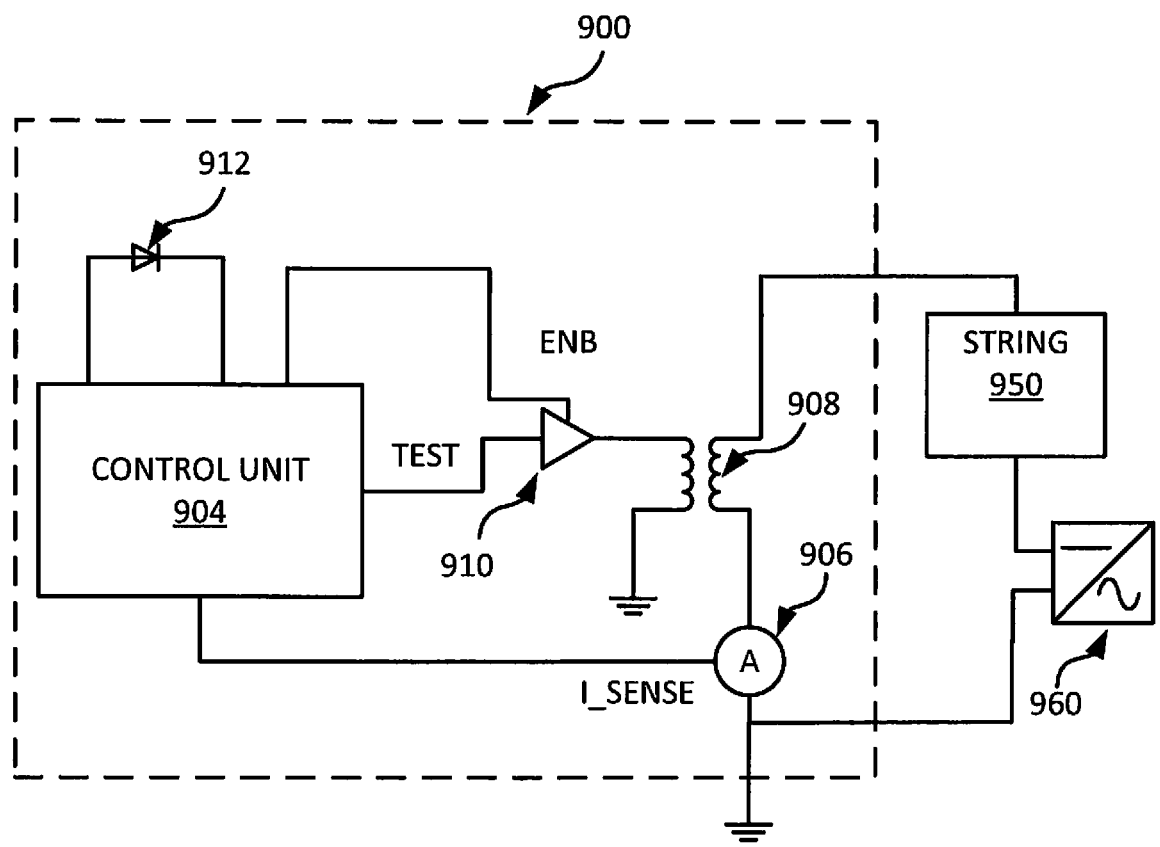
FIG. 9 is a schematic diagram of an example continuity test source.

An illustrative example of a continuity test source is described herein with reference to FIG. 9.

In one embodiment, the test signal is an unmodulated AC current with a Root Mean Square (RMS) value of 500 mA and a frequency of between 10 kHz and 150 kHz.

RSDs $212_1 \ldots 212_N$ could be co-located with and less than 10 feet from their respective panels PV panels $211_1 \ldots 211_N$ while DC disconnect switch 204, inverter 220 and grid disconnect switch 240 could be located remotely from and at a greater distance than 10 feet from PV panels $211_1 \ldots 211_N$. For example, PV panels $211_1 \ldots 211_N$ could be mounted on a building roof, RSDs $212_1 \ldots 212_N$ could be mounted on the back sides of the panels and DC disconnect switch 204, inverter 220 and grid disconnect switch 240 could be located at ground level adjacent the building. In such an embodiment RSDs $212_1 \ldots 212_N$ could satisfy the rapid shut down requirements of NEC 2014 by disconnecting PV panels $211_1 \ldots 211_N$ from panel string 261 on the occurrence of a string disconnect condition.

Each RSD $212_1 \ldots 212_N$ could perform disconnect, electrical continuity checking and safe reconnect functions for their respective PV panels $211_1 \ldots 211_N$. RSDs $212_1 \ldots 212_N$ could also perform additional functions. They could, for example, incorporate a DC to DC converter and perform Maximum Power Point Tracking (MPPT) of PV panels $211_1 \ldots 211_N$.

In one embodiment, each RSD $212_1 \ldots 212_N$ monitors the DC current in panel string 261 and disconnects its PV panel $211_1 \ldots 211_N$ from panel string 261 when the string current drops below a predetermined threshold value, illustratively 10 mA in one embodiment. A collapse in string current could indicate that DC disconnect switch 204 has opened, that AC disconnect switch inverter 220 has opened or that inverter 220 has shut down.

Each RSD $212_1 \ldots 212_N$, after disconnecting its PV panel $211_1 \ldots 211_N$ from panel string 261, could check to determine whether the string disconnect condition has been resolved and whether its PV panel can be safely reconnected to the panel string 261. Each RSD $212_1 \ldots 212_N$ could monitor its input for the presence of the test signal from continuity test source 221. If the test signal is present, then this indicates that disconnect switch 204 is closed and that there is AC continuity in the string. Under these conditions, it is safe to connect PV panels $211_1 \ldots 211_N$ to the PV string 261. If the test signal is not present, then this indicates there is no AC continuity and it is not safe to connect PV panels $211_1 \ldots 211_N$ to the string 261. For example, if DC disconnect switch 204 is open then the test signal from continuity test source 221 cannot circulate through PV string 261. However, the test signal could still circulate when DC disconnect switch 204 is closed, even if inverter 220 is shut down. String inverters typically have significant (millifarads) input capacitances. The AC frequency of the test signal could be selected such that the input impedance of inverter 220 at the test signal frequency is insignificant compared to the input impedance of an RSD $212_1 \ldots 212_N$ in its open state, with its PV panel $211_1 \ldots 211_N$ disconnected from the PV string 261.

Due to the variation in the possible number of PV panels connected to a string, their cabling lengths and the types of inverters and their associated input capacitances, and the number of PV panel strings in a PV installation it could be beneficial to tune the frequency of an AC test signal to a PV installation. Continuity test source 221 could sweep through a range of AC test signal frequencies, for example, to find the frequency corresponding to the highest test current. Continuity test source 221 itself, or another element, could include one or more sensors to monitor PV system response to a test signal input and determine characteristics of a test signal to be used in conjunction with any particular PV installation. The test current could be measured by the test source 221 during tuning.

Figure 2B:
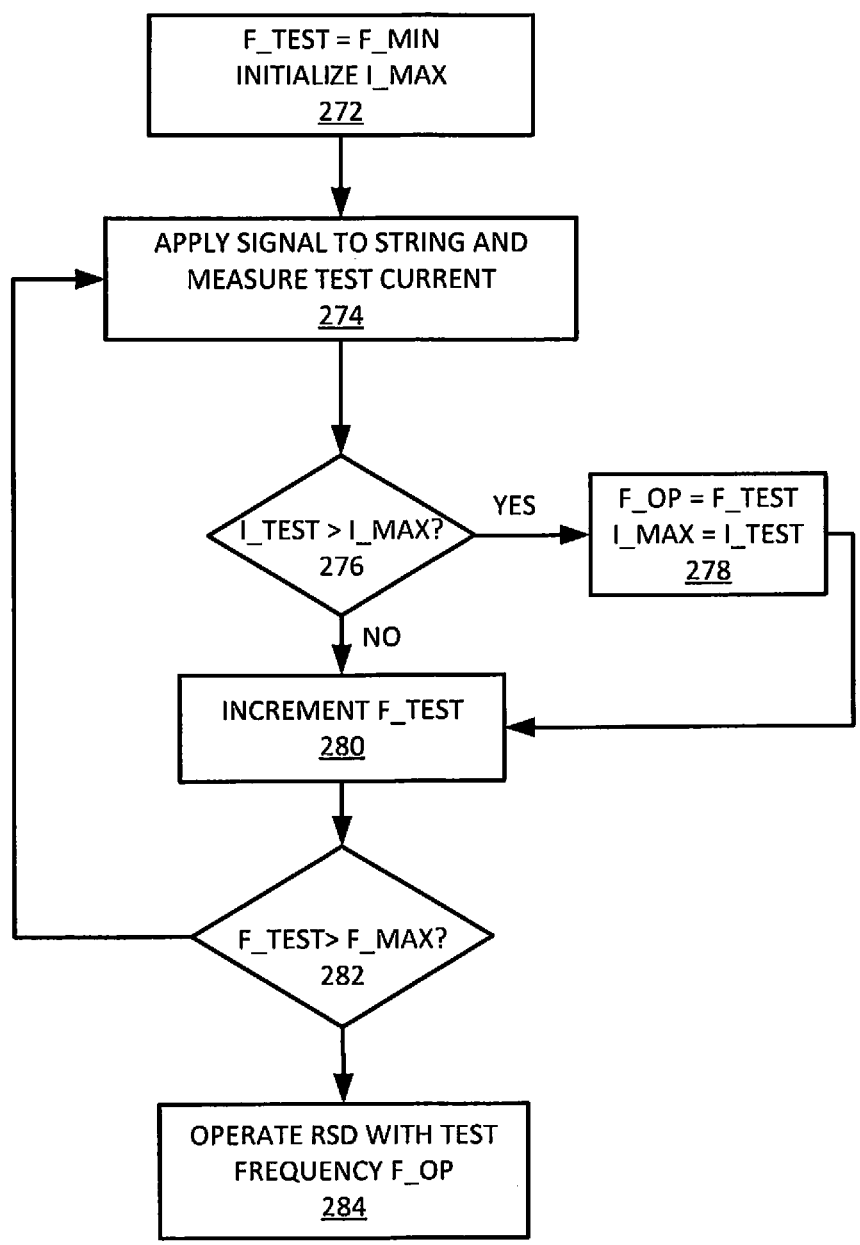
FIG. 2B is a flow diagram of an example test signal tuning method.

FIG. 2B is a flow diagram of an example test signal tuning method 270. The test signal frequency F_TEST is set to a minimum value of F_MIN and the value of the maximum test current is initialized to zero at 272. The test signal is applied to the string and the test current (I_TEST) created by the applied signal is measured at 274. At 276 it is determined whether the test current (I_TEST) is greater than the previously recorded maximum test current (I_MAX). If the test current is greater than the maximum test current (YES at 276) then the operating frequency of the RSD (F_OP) is assigned the value of F_TEST and the maximum test current (I_MAX) is assigned the value of the test current. If the test current is not greater than the maximum test current (NO at 276) then the value of F_OP is not changed.

The test frequency is incremented at 280. The step size of the test frequency increments could be determined, for example, based on any one or more of target precision or granularity of a frequency sweep, a range of frequencies to be swept, a target maximum number of tuning cycles, a target maximum tuning time, and/or other parameters. At 282 it is determined whether the test frequency exceeds a maximum value of the test frequency (F_MAX). If the test frequency does not exceed the maximum value of the test frequency (NO at 282) then a test signal at the new frequency is applied to the string at 274. If the test frequency exceeds the maximum value of the test frequency (YES at 282) then the tuning cycle ends and the RSD operates with a test signal frequency F_OP at 284.

Figure 3:
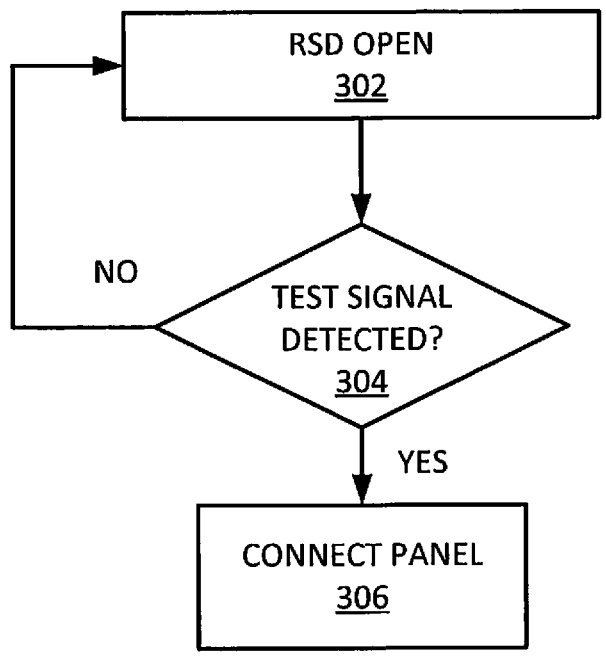
FIG. 3 is a flow diagram of a safe reconnect method using a continuity test source.

FIG. 3 is a flow diagram of a safe reconnect method using a continuity test source. At 302 an RSD is in its open state due to a previous string disconnect condition and the PV panel is disconnected from the panel string. At 304 the RSD monitors for a test signal at its input. If the test signal is not detected (NO at 304) then the RSD returns to or remains in the previous (open) state at 302. If the test signal is detected (YES at 304) then the RSD connects the panel to the panel string at 306.

Figure 4:
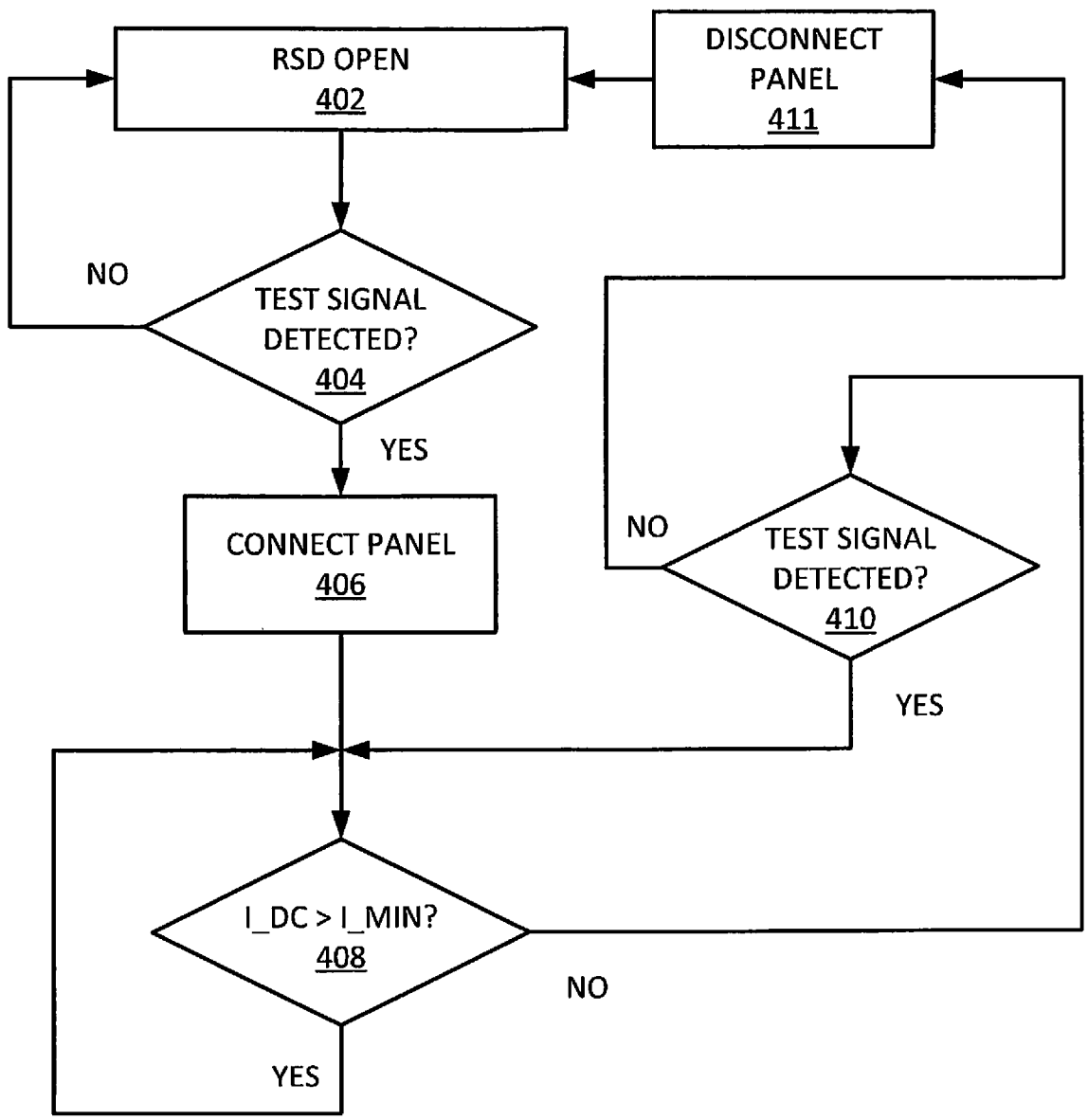
FIG. 4 is a flow diagram of another safe reconnect method using a continuity test source.

FIG. 4 is a flow diagram of another safe reconnect method using a continuity test source. At 402 the RSD is in its open state due to a previous string disconnect condition and the PV panel is disconnected from the panel string. At 404 the RSD monitors for a test signal at its input. If the signal is not detected (NO at 404) then the RSD returns to or remains in the previous (open) state at 402. If the test signal is detected (YES at 404) then the RSD connects the panel to the panel string at 406. At 408 the RSD checks for the presence of a DC string current (I_DC) larger than a threshold value (I_MIN), which is 10 mA in an example noted above. If the string current is larger than the threshold (YES at 408) then the RSD recirculates through the string current check at 408. If the string current is not larger than the threshold (NO at 408) then the RSD again monitors for the test signal at 410. If the test signal is still present (YES at 410) then the RSD again monitors for a DC string current greater than the minimum value at 408. Some inverters have a mandatory waiting period after power has been restored to their inputs before they will return to service and begin to convert power. Thus, the RSD could circulate between 408 and 410 for this waiting period. Although not shown, the RSD could exit this loop on exceeding a maximum time or a maximum number of iterations, for example, and disconnect the panel at 411. If the test signal is not detected (NO at 410) then the RSD disconnects the PV panel from the string at 411 and returns to the RSD open state at 402.

Figure 5:
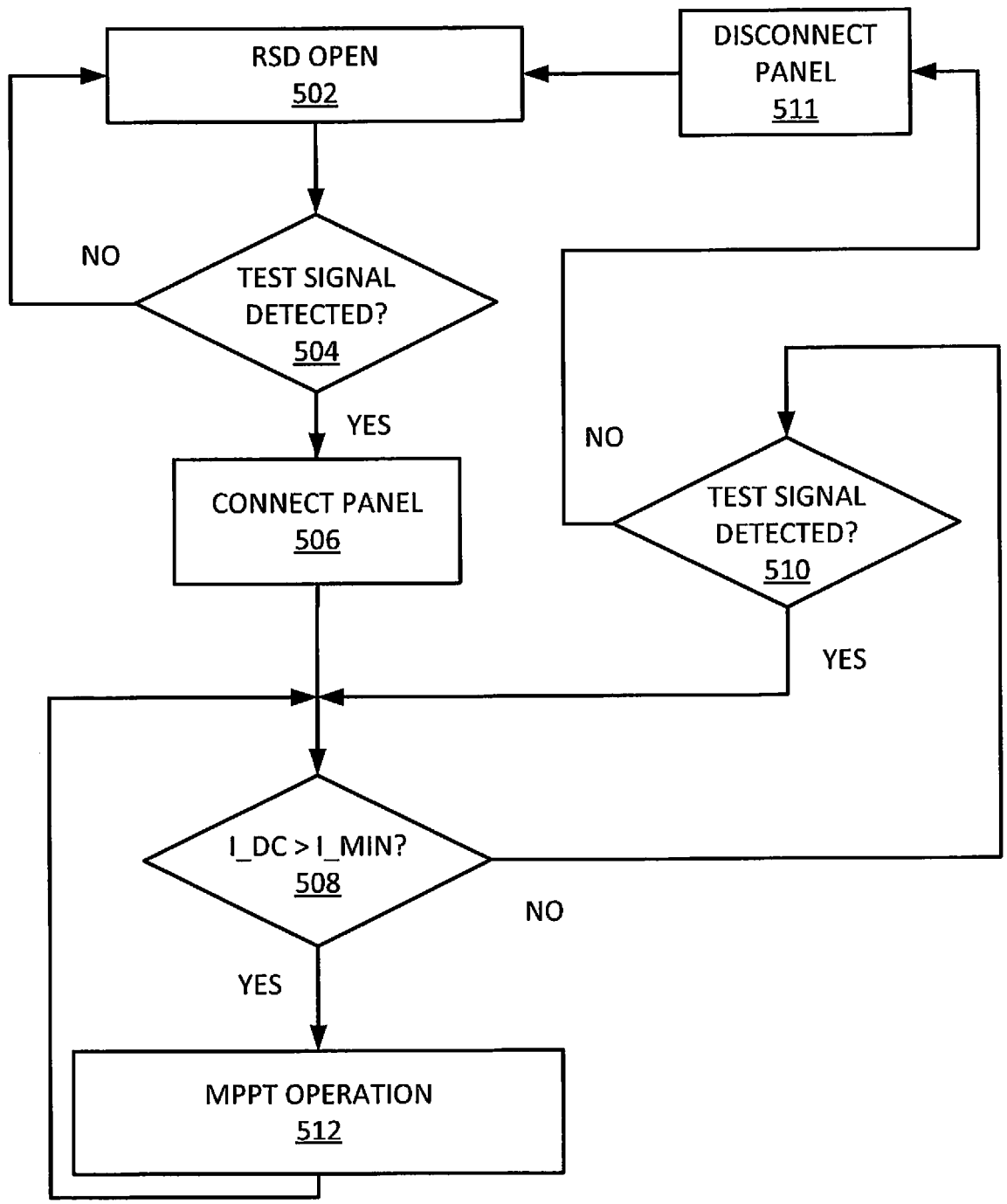
FIG. 5 is a flow diagram of a safe reconnect method using an RSD suitable for Maximum Power Point Tracking.

FIG. 5 is a flow diagram of a safe reconnect method using an RSD suitable for Maximum Power Point Tracking. At 502 the RSD is in its open state due to a previous string disconnect condition and the PV panel is disconnected from the panel string. At 504 the RSD monitors for a test signal at its input. If the test signal is not detected (NO at 504) then the RSD returns to or remains in the previous (open) state at 502. If the test signal is detected (YES at 504) then the RSD connects the panel to the panel string at 506. At 508 the RSD checks for the presence of a DC string current (I_DC) larger than a threshold value (I_MIN). If the string current is larger than the threshold (YES at 508) then the RSD begins to perform maximum power point tracking for its panel at 512. The RSD then returns to 508 to again check the value of the string current. If the string current is not larger than the threshold (NO at 508) then the RSD again monitors for the presence of the test signal at 510. If the test signal is still present (YES at 510) then RSD again monitors for a DC string current greater than the minimum value at 508. Some inverters have a mandatory waiting period after power has been restored to their inputs before they will return to service and begin to convert power. Thus, the RSD could circulate between 508 and 510 for this waiting period. If the test signal is not detected (NO at 510) then the RSD disconnects the PV panel from the string at 511 and returns to the RSD open state at 502. As noted above, the RSD could exit the 510/508 loop and disconnect the panel at 511 if string current still does not exceed I_MIN after a maximum time or a maximum number of iterations, for example.

Figure 6:
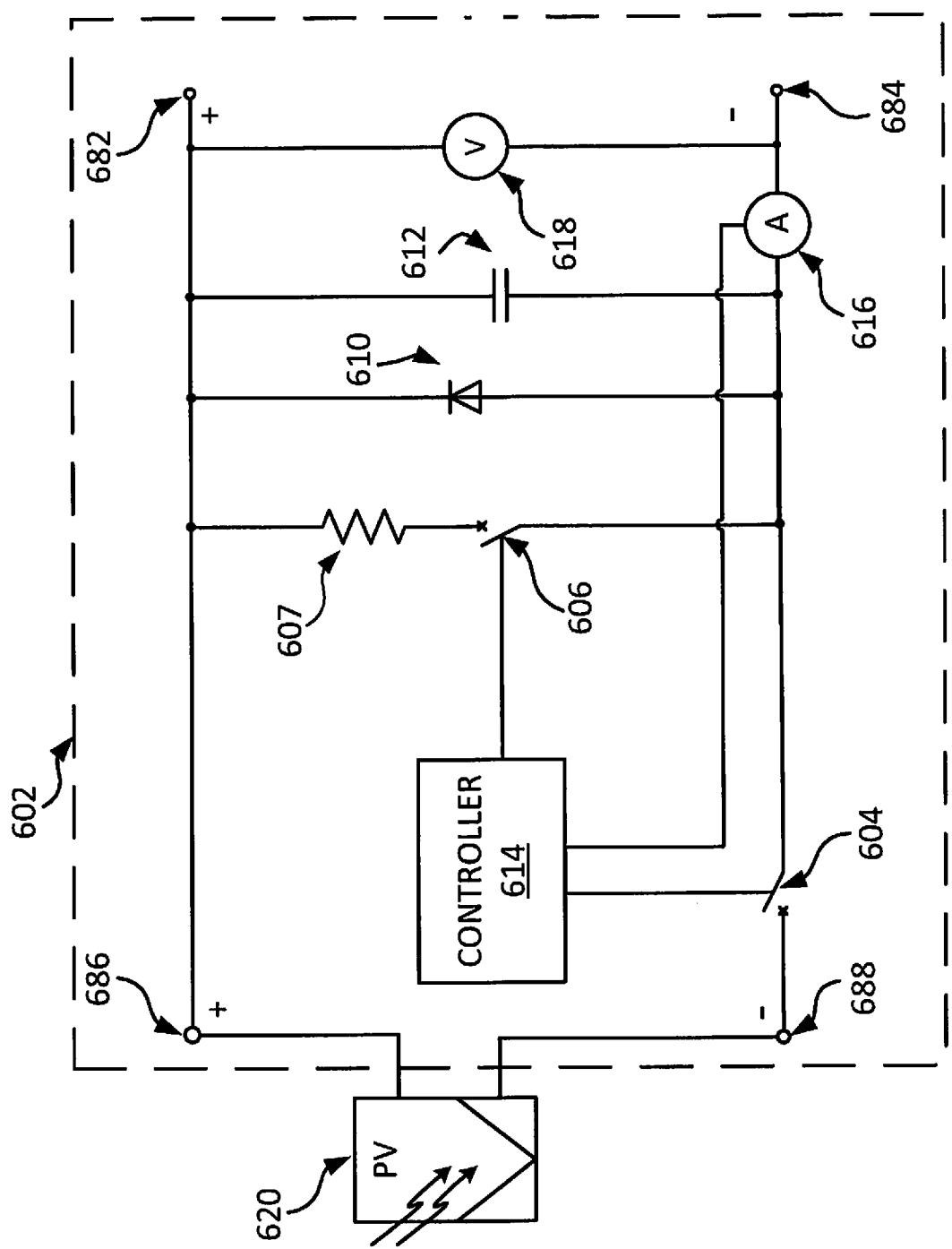
FIG. 6 is a schematic diagram of an example RSD.

FIG. 6 is a schematic diagram of an example RSD. RSD 602 comprises series switch 604, shunt switch 606, bleed resistor 607, diode 610, capacitance 612, controller 614, current sensor 616 and voltage sensor 618. RSD 602 connects to PV panel 620 at terminal pair 686, 688 and connects to a PV string (not shown) at terminal pair 682, 684.

Switches 604, 606 could be implemented using any of a variety of means, including but not limited to: power Metal Oxide Semiconductor Field Effect Transistors (MOSFETs), Insulated Gate Bipolar Transistors (IGBTs), thyristors, and/or relays, for example.

The states (open or closed) of series switch 604 and shunt switch 606 are controlled by controller 614. Controller 614 could be a single integrated circuit or a collection of components. Controller 614 could include microcontroller, a Field Programmable Gate Array (FPGA) or an Application Specific Integrated Circuit (ASIC), for example. In one embodiment controller 614 is powered from PV panel 620.

Current sensor 616 senses current, and could be implemented using an ammeter, for example. In one embodiment current sensor 616 is a resistor. Voltage sensor 618 senses the voltage across terminals 682, 684 of RSD 602, and could be implemented using a voltmeter, for example. Although shown as separate from controller 614, in some embodiments current sensor 616 and/or voltage sensor 618, or current/voltage sensing functions, could be incorporated into controller 614.

Controller 614 monitors the string current using current sensor 616, and may calculate DC and AC values of the string current from values supplied by current sensor 616. In one embodiment the current sense values are digitized and digitally processed.

RSD 602 could connect panel 620 to a panel string by closing series switch 604 and opening shunt switch 606.

RSD 602 could disconnect panel 620 from a PV panel string by opening series switch 604. In one embodiment controller 614 disconnects PV panel 620 from a PV panel string by opening series switch 604 and closing shunt switch 606. The closing of shunt switch 606 could improve the safety of the PV string by discharging capacitance 612 and reducing the voltage at terminal 682, 684 to zero. Bleed resistor 607 could be sized to limit the current through switch 606 but still allow capacitor 612 to discharge safely. In one embodiment resistor 607 has a value of 300 kOhms and capacitance 612 has a value of 10 uFarads.

In another embodiment controller 614 disconnects PV panel 620 from a PV panel string by opening series switch 604 and closing shunt switch 606 and then opening shunt switch 606 when the voltage across terminal pair 682, 684 decreases to a safe level. The opening of shunt switch 606 could improve safety by preventing the accidental discharge of an inverter's input capacitance (e.g. the input capacitance of inverter 220 of FIG. 2A). An inverter's input capacitance could be discharged if its DC disconnect switch (e.g. 204 of FIG. 2A) were to be opened during operation (causing the RSDs in a string to disconnect their panels), and then subsequently closed before the charge stored on its input capacitance had dissipated. The charged inverter input capacitance might then be discharged through the closed shunt switch (e.g. switch 606 of FIG. 6) in each RSD unless the shunt switches had been reopened.

In another embodiment, switch 606 is absent and bleed resistor 607 is coupled across capacitance 612. In this embodiment currently continually flows through bleed resistor 607.

Figure 7A:
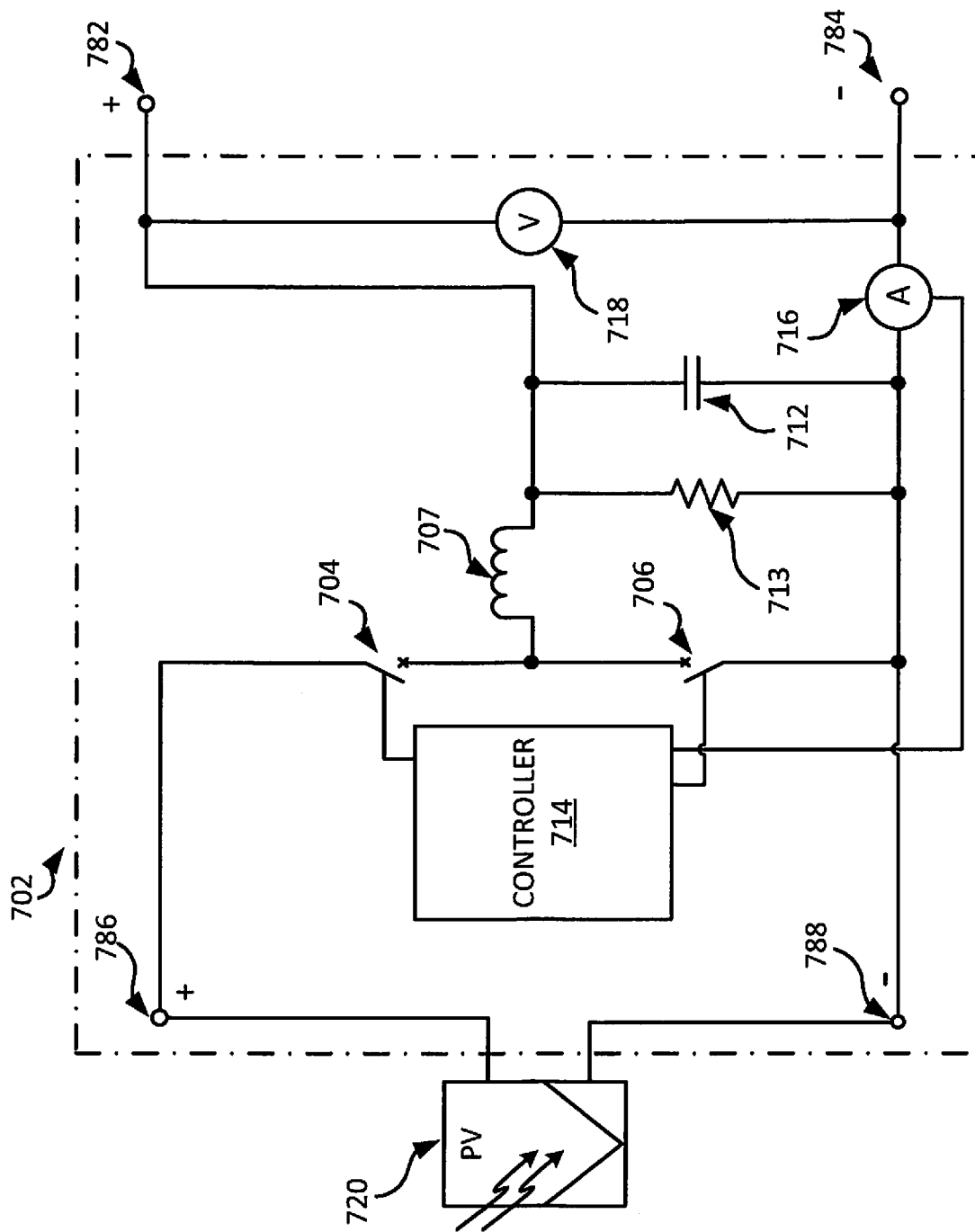
FIG. 7A is a schematic diagram of another example RSD.

FIG. 7A is a schematic diagram of another example RSD. RSD 702 comprises series switch 704, shunt switch 706, inductance 609, capacitance 712, controller 714, current sensor 716, bleed resistor 713 and voltage sensor 718, which could be implemented as described above with reference to corresponding components in FIG. 6. RSD 702 connects to PV panel 720 at terminal pair 786, 788 and connects to a PV string (not shown) at terminal pair 782, 784. The states (open or closed) of series switch 704 and shunt switch 706 are controlled by controller 714. Controller 714 monitors the string current using current sensor 716, and may calculate DC and AC values of the string current from values supplied by current sensor 716. In one embodiment the current sense values are digitized and digitally processed.

RSD 702 could also perform a DC to DC conversion function and could convert power at one voltage from PV panel 720 to power at another DC voltage at terminal pair 782, 284. RSD 702 uses a "buck" converter topology in the example shown. The DC to DC conversion function of RSD 702 could provide MPP tracking of PV panel 720.

RSD 702 could connect panel 720 to a panel string by closing series switch 704 and opening shunt switch 706.

RSD 702 could disconnect panel 720 from a PV panel string by opening series switch 704. In one embodiment controller 714 disconnects PV panel 720 from a PV panel string by opening series switch 704 and shunt switch 706. Bleed resistor 713 could improve the safety of the PV string by discharging input capacitance 712 and reducing the voltage at terminal 782, 784 to zero.

Figure 7B:
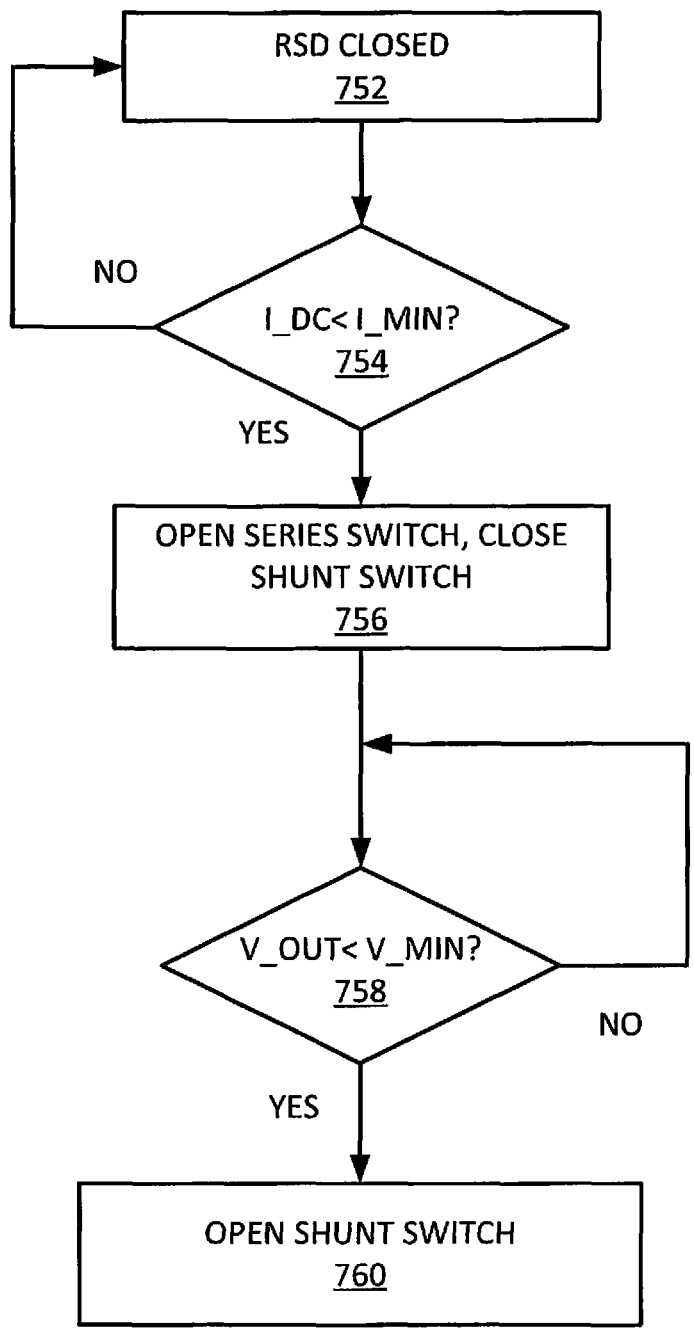
FIG. 7B is a flow diagram of an example panel disconnect method suitable for the example RSDs of FIGS. 6 and 7A.

FIG. 7B is a flow diagram of an example panel disconnect method suitable for RSD 602 of FIG. 6. At 752 the RSD is in its closed state and the PV panel is connected to the PV panel string. At 754 it is determined whether the string current (I_DC) is below a minimum value (I_MIN). If the string current is not below the minimum value (NO at 754) then the RSD remains in its closed state at 752. If the string current is below the minimum value (YES at 754) then the RSD opens its series switch (e.g. 604 of FIG. 6) and closes its shunt switch (e.g. switch 606 of FIG. 6) at 756. At 758 it is determined whether the output voltage of the RSD (V_OUT), sensed by the voltage sensor 618 in FIG. 6 or 718 in FIG. 7, is below a minimum threshold value (V_MIN). If the output voltage of the RSD (V_OUT) is below the minimum value (YES at 758) then the shunt switch is opened at 760. If the output voltage of the RSD (V_OUT) is not below the minimum value (NO at 758) then the output voltage is again evaluated at 758. V_MIN could be set to any value that is considered to be a safe value, in accordance with safety regulations or specifications for example.

Figure 8:
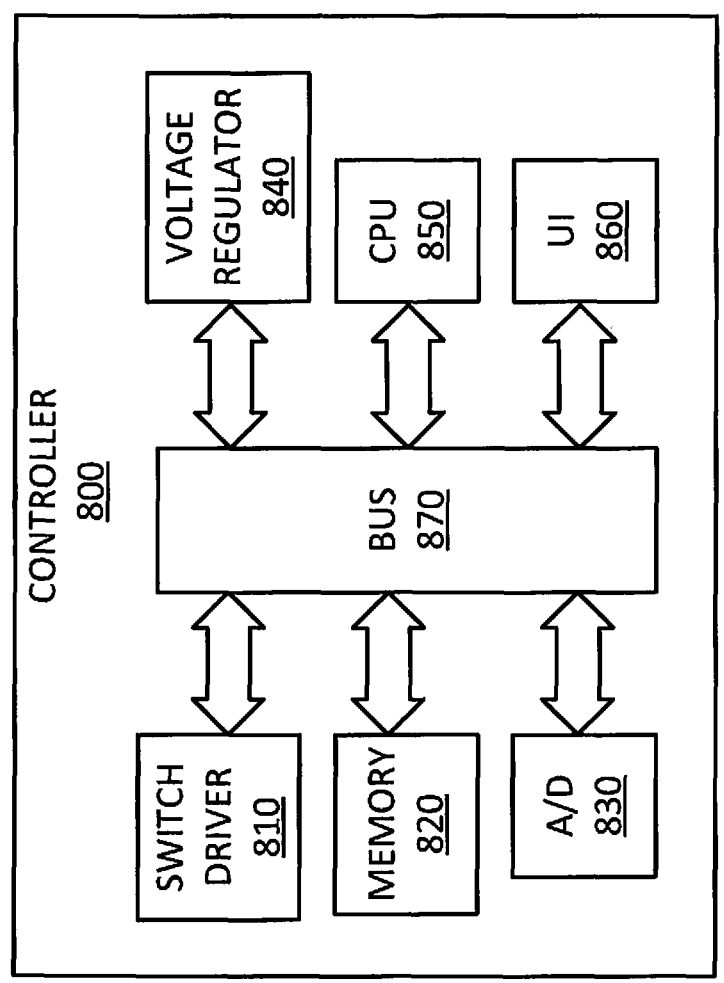
FIG. 8 is a block diagram of one embodiment of an RSD controller.

FIG. 8 is a block diagram of one embodiment of an RSD controller 800. Controller 800 could be used for controller 614 in FIG. 6 or controller 714 in FIG. 7A in accordance with the embodiments herein. Controller 800 comprises switch driver 810, memory 820, analog to digital (A/D)

converter 830, voltage regulator 840, central processing unit (CPU) 850, user interface (UI) 860, and control and data bus 870. Switch driver 810 supplies switch drive signals to switches 604, 606 in FIG. 6 or 704, 706 in FIG. 7A to control their respective opening and closing. Firmware for the operation of the controller 800 is stored in memory 820. In one embodiment, memory 820 comprises non-volatile memory such as Flash, Electrically Erasable Programmable Read Only Memory (EEPROM), EPROM, ROM, etc. The firmware is executed on CPU 850. Analog to digital (A/D) converter 830 could digitize the current and voltage readings of current sensors 616, 716 and voltage sensors 618, 718 in FIG. 6 or FIG. 7A and provide them to CPU 850 for processing and calculation of the DC and AC values of the string current and RSD output voltage. UI 860 could include one or more devices to provide outputs to a user and/or accept inputs from a user, such as to indicate the status of an RSD to a user. Control and data bus 870 interconnects these components of the controller 800 with each other as shown, in one embodiment herein.

FIG. 9 is a schematic diagram of an example continuity test source such as test source 221 of FIG. 2A. Test source 900 comprises control unit 904, amplifier 910, photosensor 912 and current sensor 906. Test source 900 is coupled to PV panel string 950 and inverter 960. Control unit 904 provides test signal (TEST) to the input of amplifier 910. Control unit 904 also provides an enable signal (ENB) to amplifier 910 to enable its operation. An amplified test signal is applied to a first winding of transformer 908 and mirrored into a second winding of the transformer. The second winding of transformer 908 is in series with PV panel string 950 and current sensor 906, which is a resistor in one embodiment. Current sensor 906 measures the current of PV string 950 and provides a current sense signal (I_SENSE) to control unit 904. Current sensor 906 provides for test signal tuning, but might not be provided in all embodiments.

Photosensor 912 provides a signal indicative of the amount of insolation present (PV_SENSE) to control unit 904.

Control unit 904 could comprise analog and digital circuitry including: an analog to digital converter for digitization of analog signals (for example I_SENSE and PV_SENSE); a digital to analog converter for generation of a test signal; and/or a real time clock for generation of sunrise and sundown times. Control unit 904 could comprise a microcontroller, microprocessor or could be an Application Specific Integrated Circuit, for example.

Particular embodiments are described by way of example herein. More generally, a method could involve applying a test signal, from a continuity test source such as test source 221 in FIG. 2A or 900 in FIG. 9, to a PV panel string such as string 261 in FIG. 2A or 950 in FIG. 9. The test signal is applied to test electrical continuity in the PV panel string and between the PV panel string and an inverter, such as inverter 220 in FIG. 2A or 960 in FIG. 9, that is coupled to the PV panel string.

The PV panel string, or another part of a PV installation, is monitored for presence of the test signal at a PV panel disconnect switch that switchably couples one or more of multiple DC PV panels in the PV panel string. This is shown by way of example at 304 in FIG. 3, 404 in FIG. 4, 504 in FIG. 5, and the RSDs in FIGS. 2A, 6, and 7A include panel disconnect switches. The switch 604 in FIG. 6 and the switches 704, 706 are examples of panel disconnect switches.

A PV panel disconnect switch is controlled to connect the one or more DC PV panels in the PV panel string where the test signal is present at the PV panel disconnect switch, as shown by way of example at 306 in FIG. 3, 406 in FIG. 4, 505 in FIG. 5. If the test signal is not present at the PV panel disconnect switch, then the PV panel disconnect switch is controlled to disconnect the one or more DC PV panels from the PV panel string. This is also shown by way of example, as the "NO" paths from 304 in FIG. 3, 404 in FIG. 4, 505 in FIG. 5.

In some embodiments, applying the test signal involves determining whether a string current flowing in the PV panel string is below a threshold, and applying the test signal to the PV panel string only where it is determined that the string current is below the threshold. Application of the test signal could also or instead be dependent upon other conditions. For example, a test source could include a clock and a calendar, and a method could involve determining from the clock and calendar of the continuity test source whether a current time is during daylight hours. The test signal could then be applied to the PV panel string only where it is determined that the current time is during daylight hours. A continuity test source could also or instead include a light sensor, as shown by way of example at 912 in FIG. 9. A method could then involve determining from the light sensor, based on readings from the sensor, whether the PV panel string is under insolation, and applying the test signal to the PV panel string only where it is determined that the PV panel string is under insolation. This insolation condition need not require the entire PV panel string to be under insolation, but rather that a light sensor reading be at or above a threshold.

After PV panels are connected in the PV panel string, those PV panels might not necessarily remain connected. In some embodiments, a method involves determining a value of DC current in the PV panel string, and controlling the PV panel disconnect switch to disconnect the one or more DC PV panels from the PV panel string where the DC current is below a threshold. This is shown by way of example in FIG. 4 at 408, 411 and in FIG. 5 at 508, 511.

As shown by way of example in FIGS. 2A and 9, the test signal could be applied from the continuity test source to the PV panel string through a transformer 230, 908. The test signal is an unmodulated AC signal in some embodiments, as also noted elsewhere herein.

In the case of an AC test signal, a method could also involve tuning a frequency of the test signal to a PV installation that includes the PV panel string and the inverter. Such tuning could involve applying test signals having a plurality of different frequencies from the continuity test source to the PV panel string (e.g., at 274 in FIG. 2B, with frequency steps applied at 282). It may then be determined which of the test signals generates a highest test current in the PV panel string. The operations illustrated at 276, 278 in FIG. 2B provide an example as to how such a determination could be made in an embodiment.

Controlling the PV panel disconnect switch to connect the one or more DC PV panels in the PV panel string could involve changing a state of the PV panel disconnect switch from an open state to a closed state. After changing the state of the PV panel disconnect switch from the open state to the closed state, a determination could be made as to whether a string current flowing in the PV panel string is above a threshold, as shown at 408 in FIG. 4 and 508 in FIG. 5. The monitoring for presence of the test signal could be repeated, as shown at 410 in FIG. 4 and 510 in FIG. 5, where the string current is not above the threshold. The determination as to the string current could be repeated, as shown at 408 in FIG. 4 and 508 in FIG. 5 where the test signal is present at the PV panel disconnect switch. Otherwise, if the string current is not above the threshold and the test signal is not present at the PV panel disconnect switch (e.g., "NO" determinations at both 408, 410 in FIG. 4 or both 508, 510 in FIG. 5, the PV panel disconnect switch could be controlled to disconnect the one or more DC PV panels from the PV panel string, such as at 411, 511 in FIGS. 4 and 5.

In some embodiments, MPPT is performed for the one or more DC PV panels by a shutdown device that includes the PV panel disconnect switch, where the string current is above the threshold. This is shown by way of example at 512 in FIG. 5. A loop between 508, 512 in FIG. 5 could provide for periodic or continuous string current monitoring during MPPT.

A shutdown device that includes the PV disconnect switch could also include terminals coupled to the PV panel string and a second switch coupled across the terminals. With reference to FIG. 6, switch 604 represents an example of a PV disconnect switch, and switch 606 represents an example of a second switch. In such embodiments, the PV panel disconnect switch could be controlled to disconnect the one or more DC PV panels from the PV panel string by opening the PV panel disconnect switch, and the second switch could also be closed, as shown by way of example at 756 in FIG. 7B. The second switch could subsequently be opened when a voltage across the terminals decreases to a predetermined level, which could be zero or another level that is considered to be a safe level, as capacitance 612 in FIG. 6 discharges for example. Monitoring of voltage across the terminals and opening of the second switch are shown by way of example at 758, 760 in FIG. 7B.

FIGS. 6 and 7A provide illustrative examples of a device that could be implemented as RSDs $212_1 \ldots 212_N$ in FIG. 2A. These examples are also illustrative of apparatus that includes a PV panel disconnect switch 604 or 704, 706 to switchably couple one or more DC PV panels in a PV panel string, and a controller 614, 714 operatively coupled to the PV panel disconnect switch. Such a controller is configured, by executing software or otherwise, to monitor for presence of a test signal that is applied to the PV panel string for testing electrical continuity in the PV panel string and between the PV panel string and an inverter that is coupled to the PV panel string. The test signal is applied by a separate continuity test source that is separate from an RSD. The controller is further configured to control the PV panel disconnect switch to connect the one or more DC PV panels in the PV panel string where the test signal is present at the PV panel disconnect switch, and to control the PV panel disconnect switch to disconnect the one or more DC PV panels from the PV panel string where the test signal is not present at the PV panel disconnect switch.

The controller could also be configured to determine a value of DC current in the PV panel string, and to control the PV panel disconnect switch to disconnect the one or more DC PV panels from the PV panel string where the DC current is below a threshold.

In some embodiments, the controller is configured to control the PV panel disconnect switch to connect the one or more DC PV panels in the PV panel string by changing a state of the PV panel disconnect switch from an open state to a closed state. The controller could be further configured to, after changing the state of the PV panel disconnect switch from the open state to the closed state: determine whether a string current flowing in the PV panel string is above a threshold; repeat monitoring for presence of the test signal where the string current is not above the threshold; repeat determining whether the string current is above the threshold where the test signal is present at the PV panel disconnect switch; and control the PV panel disconnect switch to disconnect the one or more DC PV panels from the PV panel string where the string current is not above the threshold and the test signal is not present at the PV panel disconnect switch.

The controller is further configured to perform MPPT for the one or more DC PV panels where the string current is above the threshold.

In some embodiments, an apparatus includes terminals such as 682, 684 in FIG. 6, a second switch 606 coupled across the terminals, and the controller is configured to control the PV panel disconnect switch 614 to disconnect the one or more DC PV panels from the PV panel string by opening the PV panel disconnect switch and closing the second switch, and subsequently opening the second switch when a voltage across the terminals decreases to a predetermined level.

Considering the manner in which such an apparatus operates, a method consistent with such operation could include monitoring for presence of a test signal, applied from a continuity test source to a PV panel string to test electrical continuity in the PV panel string and between the PV panel string and an inverter that is coupled to the PV panel string, at a PV panel disconnect switch that switchably couples one or more of a plurality of DC PV panels in the PV panel string. Such a method could also involve controlling the PV panel disconnect switch to connect the one or more DC PV panels in the PV panel string where the test signal is present at the PV panel disconnect switch, and controlling the PV panel disconnect switch to disconnect the one or more DC PV panels from the PV panel string where the test signal is not present at the PV panel disconnect switch.

Controlling the PV panel disconnect switch to connect the one or more DC PV panels in the PV panel string could involve changing a state of the PV panel disconnect switch from an open state to a closed state, and a method could then include, after changing the state of the PV panel disconnect switch from the open state to the closed state: determining whether a string current flowing in the PV panel string is above a threshold; repeating the monitoring where the string current is not above the threshold; repeating the determining where the test signal is present at the PV panel disconnect switch; controlling the PV panel disconnect switch to disconnect the one or more DC PV panels from the PV panel string where the string current is not above the threshold and the test signal is not present at the PV panel disconnect switch.

In some embodiments, a method also involves: performing maximum power point tracking, by a shutdown device comprising the PV panel disconnect switch, for the one or more DC PV panels where the string current is above the threshold.

A shutdown device that includes the PV disconnect switch could also include terminals coupled to the PV panel string and a second switch coupled across the terminals, in which case controlling the PV panel disconnect switch to disconnect the one or more DC PV panels from the PV panel string could involve: opening the PV panel disconnect switch and closing the second switch; subsequently opening the second switch when a voltage across the terminals decreases to a predetermined level.

In some embodiments, a method also involves: determining a value of DC current in the PV panel string; and controlling the PV panel disconnect switch to disconnect the one or more DC PV panels from the PV panel string where the DC current is below a threshold.

Many of these operations are also discussed elsewhere herein, with reference to illustrative examples in the drawings.

What has been described is merely illustrative of the application of principles of embodiments of the present disclosure. Other arrangements and methods can be implemented by those skilled in the art. For example, a continuity test source might not be a separate device and could be part of the string inverter.

Any divisions of function in the drawings are not intended to be limiting or exhaustive. Other embodiments could include additional, fewer, and/or different components than shown. Similarly, other method embodiments could include additional, fewer, and/or different operations performed in an order similar to or different from the orders shown in the drawings and described above.

Embodiments are described herein primarily with reference to a PV panel string, but could be implemented in conjunction with a PV installation that includes multiple PV panel strings. A test signal could be applied from a continuity test source to the PV panel strings, to test electrical continuity in each PV panel string and between the PV panel strings and an inverter that is coupled to the PV panel strings. For each PV panel string, if the test signal is detected at a PV panel disconnect switch that switchably couples one or more DC PV panels in the PV panel string, then the PV panel disconnect switch in that PV panel string is controlled to connect the one or more DC PV panels in the PV panel string. Otherwise, the PV panel disconnect switch is controlled to disconnect the one or more DC PV panels from that PV panel string. Tuning an AC test signal in a multi-string embodiment could involve applying test signals at multiple different frequencies to the PV panel strings, and determining which of the test signals generates a highest total test current summed over all of the PV panel strings.

What is claimed is:

1. A method comprising:
   applying a test signal, from a continuity test source to a photovoltaic (PV) panel string, to test electrical continuity in the PV panel string and between the PV panel string and an inverter that is coupled to the PV panel string;
   monitoring for presence of the test signal at a PV panel disconnect switch that switchably couples one or more of a plurality of Direct Current (DC) PV panels in the PV panel string;
   controlling the PV panel disconnect switch to connect the one or more DC PV panels in the PV panel string where the test signal is present at the PV panel disconnect switch;
   controlling the PV panel disconnect switch to disconnect the one or more DC PV panels from the PV panel string where the test signal is not present at the PV panel disconnect switch,
   wherein the applying comprises:
   determining whether a string current flowing in the PV panel string is below a threshold;
   applying the test signal to the PV panel string only where it is determined that the string current is below the threshold.

2. The method of claim 1 further comprising:
   determining a value of DC current in the PV panel string;
   controlling the PV panel disconnect switch to disconnect the one or more DC PV panels from the PV panel string where the DC current is below a threshold.

3. The method of claim 1, wherein the applying comprises applying the test signal from the continuity test source to the PV panel string through a transformer.

4. The method of claim 1, wherein the test signal is an unmodulated Alternating Current (AC) signal.

5. The method of claim 1, wherein the test signal is an Alternating Current (AC) signal, wherein the method further comprises:
   tuning a frequency of the test signal to a PV installation comprising the PV panel string and the inverter.

6. The method of claim 5, wherein the tuning comprises:
   applying test signals having a plurality of different frequencies from the continuity test source to the PV panel string;
   determining which of the test signals generates a highest test current in the PV panel string.

7. The method of claim 1, wherein controlling the PV panel disconnect switch to connect the one or more DC PV panels in the PV panel string comprises changing a state of the PV panel disconnect switch from an open state to a closed state, and wherein the method further comprises, after changing the state of the PV panel disconnect switch from the open state to the closed state:
   repeating the monitoring where the string current is not above the threshold;
   repeating the determining where the test signal is present at the PV panel disconnect switch;
   controlling the PV panel disconnect switch to disconnect the one or more DC PV panels from the PV panel string where the string current is not above the threshold and the test signal is not present at the PV panel disconnect switch.

8. The method of claim 7, further comprising:
   performing maximum power point tracking, by a shutdown device comprising the PV panel disconnect switch, for the one or more DC PV panels where the string current is above the threshold.

9. The method of claim 1, wherein a shutdown device that comprises the PV disconnect switch further comprises terminals coupled to the PV panel string and a second switch coupled across the terminals, wherein controlling the PV panel disconnect switch to disconnect the one or more DC PV panels from the PV panel string comprises:
   opening the PV panel disconnect switch and closing the second switch;
   subsequently opening the second switch when a voltage across the terminals decreases to a predetermined level.

10. A method comprising:
    applying a test signal, from a continuity test source to a photovoltaic (PV) panel string, to test electrical continuity in the PV panel string and between the PV panel string and an inverter that is coupled to the PV panel string;
    monitoring for presence of the test signal at a PV panel disconnect switch that switchably couples one or more of a plurality of Direct Current (DC) PV panels in the PV panel string;
    controlling the PV panel disconnect switch to connect the one or more DC PV panels in the PV panel string where the test signal is present at the PV panel disconnect switch;
    controlling the PV panel disconnect switch to disconnect the one or more DC PV panels from the PV panel string where the test signal is not present at the PV panel disconnect switch;

determining from a clock and calendar of the continuity test source whether a current time is during daylight hours;
applying the test signal to the PV panel string only where it is determined that the current time is during daylight hours.

11. A method comprising:
applying a test signal, from a continuity test source to a photovoltaic (PV) panel string, to test electrical continuity in the PV panel string and between the PV panel string and an inverter that is coupled to the PV panel string;
monitoring for presence of the test signal at a PV panel disconnect switch that switchably couples one or more of a plurality of Direct Current (DC) PV panels in the PV panel string;
controlling the PV panel disconnect switch to connect the one or more DC PV panels in the PV panel string where the test signal is present at the PV panel disconnect switch;
controlling the PV panel disconnect switch to disconnect the one or more DC PV panels from the PV panel string where the test signal is not present at the PV panel disconnect switch;
determining from a light sensor of the continuity test source whether the PV panel string is under insolation;
applying the test signal to the PV panel string only where it is determined that the PV panel string is under insolation.

12. Apparatus comprising:
a photovoltaic (PV) panel disconnect switch to switchably couple one or more Direct Current (DC) PV panels in a PV panel string;
a controller, operatively coupled to the PV panel disconnect switch, to monitor for presence of a test signal applied from a continuity test source to the PV panel string for testing electrical continuity in the PV panel string and between the PV panel string and an inverter that is coupled to the PV panel string; to control the PV panel disconnect switch to connect the one or more DC PV panels in the PV panel string where the test signal is present at the PV panel disconnect switch; and to control the PV panel disconnect switch to disconnect the one or more DC PV panels from the PV panel string where the test signal is not present at the PV panel disconnect switch,
wherein the controller is further configured to determine a value of DC current in the PV panel string, and to control the PV panel disconnect switch to disconnect the one or more DC PV panels from the PV panel string where the DC current is below a threshold.

13. The apparatus of claim 12, wherein the test signal is an unmodulated Alternating Current (AC) signal.

14. The apparatus of claim 12,
wherein the controller is configured to control the PV panel disconnect switch to connect the one or more DC PV panels in the PV panel string by changing a state of the PV panel disconnect switch from an open state to a closed state,
wherein the controller is further configured to, after changing the state of the PV panel disconnect switch from the open state to the closed state: repeat monitoring for presence of the test signal where the string current is not above the threshold; repeat determining whether the string current is above the threshold where the test signal is present at the PV panel disconnect switch; and control the PV panel disconnect switch to disconnect the one or more DC PV panels from the PV panel string where the string current is not above the threshold and the test signal is not present at the PV panel disconnect switch.

15. The apparatus of claim 14, wherein the controller is further configured to perform maximum power point tracking for the one or more DC PV panels where the string current is above the threshold.

16. The apparatus of claim 12, further comprising:
terminals coupled to the PV panel string;
a second switch coupled across the terminals,
wherein the controller is configured to control the PV panel disconnect switch to disconnect the one or more DC PV panels from the PV panel string by opening the PV panel disconnect switch and closing the second switch, and subsequently opening the second switch when a voltage across the terminals decreases to a predetermined level.

17. The method of claim 11, wherein the applying comprises applying the test signal from the continuity test source to the PV panel string through a transformer.

18. The method of claim 11, wherein the test signal is an unmodulated Alternating Current (AC) signal.

19. The method of claim 11, wherein the test signal is an Alternating Current (AC) signal, wherein the method further comprises:
tuning a frequency of the test signal to a PV installation comprising the PV panel string and the inverter.

20. The method of claim 10, wherein the applying comprises applying the test signal from the continuity test source to the PV panel string through a transformer.

21. The method of claim 10, wherein the test signal is an unmodulated Alternating Current (AC) signal.

* * * * *